US012740257B2

United States Patent

Jeong et al.

(12) United States Patent
(10) Patent No.: US 12,740,257 B2
(45) Date of Patent: Sep. 15, 2026

(54) DISPLAY APPARATUS HAVING AN OXIDE SEMICONDUCTOR

(71) Applicant: LG Display Co., Ltd., Seoul (KR)

(72) Inventors: Duk Young Jeong, Seoul (KR); Ki Sul Cho, Seoul (KR); Jeong Yeop Lee, Seoul (KR); Jang Dae Kim, Seoul (KR); Min Cheol Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 551 days.

(21) Appl. No.: 17/885,072

(22) Filed: Aug. 10, 2022

(65) Prior Publication Data

US 2023/0061983 A1 Mar. 2, 2023

(30) Foreign Application Priority Data

Aug. 30, 2021 (KR) ........................ 10-2021-0114730

(51) Int. Cl.
*H10K 59/126* (2023.01)
*H10K 59/124* (2023.01)

(52) U.S. Cl.
CPC ......... *H10K 59/126* (2023.02); *H10K 59/124* (2023.02)

(58) Field of Classification Search
CPC . H10K 59/126; H10K 59/124; H10D 30/6723
See application file for complete search history.

(56) References Cited

U.S. PATENT DOCUMENTS 11,271,015 B2 3/2022 Park et al.
12,342,689 B2 6/2025 Wang et al.
2012/0319112 A1* 12/2012 Cho .................... H01L 29/7869 257/E29.273
2014/0183476 A1 7/2014 Kwon et al.
(Continued)

FOREIGN PATENT DOCUMENTS

CN 112366222 A 2/2021
CN 112397550 A 2/2021
(Continued)

OTHER PUBLICATIONS

Office Action dated Jun. 7, 2023, issued in corresponding TW Patent Application No. 111125104.
(Continued)

*Primary Examiner* — Matthew C Landau
*Assistant Examiner* — David W Ward
(74) *Attorney, Agent, or Firm* — Morgan, Lewis & Bockius LLP

(57) ABSTRACT

A display apparatus may include at least one switching thin film transistor and a driving thin film transistor, which are disposed on a device substrate. The driving thin film transistor may include a driving semiconductor pattern made of an oxide semiconductor. A light-blocking pattern may be disposed between the device substrate and the driving semiconductor pattern. The light-blocking pattern may be disposed close to the driving semiconductor pattern. Thus, in the display apparatus, a current variation value according to a voltage applied to the driving gate electrode of the driving
(Continued)

thin film transistor may be reduced, without changing the characteristics of the switching thin film transistor. Thereby, in the display apparatus, the occurrence of a spot in low grayscale may be prevented.

16 Claims, 4 Drawing Sheets

(56) References Cited

U.S. PATENT DOCUMENTS

| | | | | |
|---|---|---|---|---|
| 2015/0179724 | A1* | 6/2015 | Lee | H10K 59/10 438/23 |
| 2016/0254276 | A1* | 9/2016 | Tada | H10D 86/421 257/72 |
| 2017/0338252 | A1* | 11/2017 | Lee | H10D 86/481 |
| 2019/0172954 | A1 | 6/2019 | Zhou et al. | |
| 2020/0111855 | A1* | 4/2020 | Bae | H01L 27/1255 |
| 2020/0373370 | A1 | 11/2020 | Lius et al. | |
| 2020/0395426 | A1* | 12/2020 | Han | H01L 27/1248 |
| 2020/0411622 | A1* | 12/2020 | Sun | H10D 30/6725 |
| 2021/0011536 | A1 | 1/2021 | Hanada et al. | |
| 2021/0028258 | A1* | 1/2021 | Lee | H01L 27/1222 |
| 2021/0036029 | A1 | 2/2021 | Park et al. | |
| 2021/0066505 | A1 | 3/2021 | Lee et al. | |
| 2021/0104558 | A1 | 4/2021 | Kim et al. | |
| 2021/0143239 | A1 | 5/2021 | Kim et al. | |
| 2021/0202634 | A1* | 7/2021 | Moon | H10D 86/60 |
| 2021/0249495 | A1 | 8/2021 | Lee et al. | |
| 2021/0265442 | A1 | 8/2021 | Cho et al. | |
| 2021/0327924 | A1* | 10/2021 | He | H10D 86/451 |
| 2021/0359279 | A1* | 11/2021 | Cai | H10K 59/123 |
| 2021/0405411 | A1 | 12/2021 | Hanada et al. | |
| 2022/0149137 | A1* | 5/2022 | Wang | H10D 86/423 |
| 2022/0199745 | A1* | 6/2022 | Baek | H10K 59/124 |
| 2022/0302239 | A1* | 9/2022 | Kim | H10K 77/111 |
| 2023/0022035 | A1* | 1/2023 | Cha | G06F 3/0445 |
| 2023/0053184 | A1* | 2/2023 | Kim | H10K 71/00 |
| 2023/0065135 | A1* | 3/2023 | Kim | H10K 50/865 |
| 2023/0131807 | A1 | 4/2023 | Cho et al. | |
| 2024/0341133 | A1* | 10/2024 | Wang | H10D 86/423 |

FOREIGN PATENT DOCUMENTS

| | | | |
|---|---|---|---|
| CN | 112838098 | A | 5/2021 |
| CN | 113314565 | A | 8/2021 |
| JP | 2002-311857 | A | 10/2002 |
| JP | 2020-017558 | A | 1/2020 |
| KR | 10-2019-0061823 | A | 6/2019 |
| KR | 10-2019-0073868 | A | 6/2019 |
| WO | 2020184533 | A | 9/2020 |

OTHER PUBLICATIONS

Office Action dated Jan. 23, 2024 in Japanese Patent Application No. 2022-130606.

Japanese Office Action dated Aug. 29, 2023, issued in corresponding Japanese Patent Application No. 2022-130606.

Extended European Search Report for Application No. 22189314.2, dated Jan. 27, 2023, 11 pages.

Notice of Allowance issued on Apr. 29, 2024 in Taiwanese Patent Application No. 111125104 with English translation.

Notice of Allowance issued on May 7, 2024 in Japanese Patent Application No. 2022-130606.

Office Action issued on May 23, 2025 in Korean Patent Application No. 10-2021-0114730 (Note: CN112838098A and US2016/0254276A1 cited therein are already of record.).

Extended European Search Report dated Jul. 27, 2026 in the corresponding European Patent Application No. 26174319.9.

* cited by examiner

K1
350
330
370
170
C2
160
150
142
d1
141
130
120
310
710

K2
430
450
470
160
C2
150
410
d2
C1
142
720
141
130
120

DISPLAY APPARATUS HAVING AN OXIDE SEMICONDUCTOR

CROSS-REFERENCE TO RELATED APPLICATION

This application claims the benefit of and priority to Korean Patent Application No. 10-2021-0114730 filed on Aug. 30, 2021, the entirety of which is incorporated herein by reference for all purposes as if fully set forth herein.

BACKGROUND

1. Technical Field

The present disclosure relates to apparatuses and methods and particularly to, for example, without limitation, a display apparatus having an oxide semiconductor.

2. Discussion of the Related Art

Generally, a display apparatus may provide an image to a user. For example, the display apparatus may include a plurality of light-emitting devices. Each of the light-emitting devices may emit light displaying a specific color. For example, each of the light-emitting devices may include a light-emitting layer between a first electrode and a second electrode.

The light-emitting devices may be disposed on a device substrate. Driving circuits for controlling each light-emitting device may be disposed on the device substrate. For example, each of the light-emitting devices may be electrically connected to one of the driving circuits. Each of the driving circuits may generate a driving current corresponding to a data signal according to a scan signal. For example, each of the driving circuits may include a plurality of thin film transistors.

Some of the thin film transistors may include a semiconductor pattern made of an oxide semiconductor. For example, each of the driving circuits may include a driving thin film transistor being electrically connected to the corresponding light-emitting device, and the driving thin film transistor may include a semiconductor pattern made of an oxide semiconductor. However, in the driving thin film transistor, a current variation value according to a voltage applied to the gate electrode may be large. Thus, in the display apparatus, a spot may occur in low grayscale. In addition, if a thickness of a gate insulating layer between the semiconductor pattern and the gate electrode of the driving thin film transistor is controlled to reduce the current variation value according to a voltage applied to the gate electrode of the driving thin film transistor, characteristics of a switching thin film transistor being formed simultaneously with the driving thin film transistor may be deteriorated. Therefore, in the display apparatus, the quality of the image may be degraded.

The description provided in the discussion of the related art section should not be assumed to be prior art merely because it is mentioned in or associated with that section. The discussion of the related art section may include information that describes one or more aspects of the subject technology.

SUMMARY

The inventors of the present disclosure have recognized the problems and disadvantages of the related art and have performed extensive research and experiments. The inventors have thus developed a new invention, which includes a display apparatus that substantially obviates one or more problems due to limitations and disadvantages of the related art.

In one or more aspects, an object of the present disclosure is to provide a display apparatus capable of preventing the occurrence of a spot in low grayscale.

In one or more aspects, another object of the present disclosure is to provide a display apparatus capable of reducing the current variation value according to a voltage applied to a gate electrode of a driving thin film transistor, without changing the characteristics of a switching thin film transistor.

The objects of the present disclosure are not limited to those described above, and additional features, advantages, and objects of the present disclosure are set forth in part in the description that follows and in part will become apparent from the present disclosure or may be learned by practice of the inventive concepts provided herein. Other features, advantages, and objects of the present disclosure may be realized and attained by the descriptions provided in the present disclosure, or derivable therefrom, and the claims hereof as well as the appended drawings.

To achieve these objects and other advantages of the present disclosure, as embodied and broadly described herein, in one or more example embodiments, there is provided a display apparatus comprising a device substrate. A first separation insulating layer and a first switching thin film transistor may be disposed on the device substrate. The first switching thin film transistor may include a first semiconductor pattern between the device substrate and the first separation insulating layer. A second switching thin film transistor and a driving thin film transistor may be disposed on the first separation insulating layer. The second switching thin film transistor may include a second semiconductor pattern. The second semiconductor pattern may include a material different from the first semiconductor pattern. The driving thin film transistor may include a driving semiconductor pattern. The driving semiconductor pattern may include the same material as the second semiconductor pattern. A first light-blocking pattern may be disposed between the device substrate and the first separation insulating layer. The first light-blocking pattern may overlap the second semiconductor pattern. A second light-blocking pattern may be disposed between the device substrate and the driving semiconductor pattern. The second light-blocking pattern may include a conductive material. A distance between the second light-blocking pattern and the driving semiconductor pattern may be smaller than a distance between the first light-blocking pattern and the second semiconductor pattern.

The first semiconductor pattern may include silicon. The second semiconductor pattern and the driving semiconductor pattern may include an oxide semiconductor.

The first light-blocking pattern may include a material different from the second light-blocking pattern.

The first light-blocking pattern may include the same material as a gate electrode of the first switching thin film transistor.

A second separation insulating layer may be disposed between the second light-blocking pattern and the driving semiconductor pattern. The second separation insulating layer may extend between the first separation insulating layer and the second semiconductor pattern.

The second separation insulating layer may have a thickness thinner than the first separation insulating layer.

The second separation insulating layer may include the same material as the first separation insulating layer.

The first separation insulating layer and the second separation insulating layer may be an inorganic insulating layer made of silicon oxide.

In one or more example embodiments, there is provided a display apparatus comprising a device substrate. A first switching thin film transistor and a first gate insulating layer may be disposed on the device substrate. The first switching thin film transistor may include a first semiconductor pattern, a first gate electrode, a first source electrode and a first drain electrode. The first gate insulating layer may extend between the first semiconductor pattern and the first gate electrode. A first separation insulating layer may be disposed on the first gate insulating layer. The first separation insulating layer may extend between the first gate electrode and the first source electrode, and between the first gate electrode and the first drain electrode. A second switching thin film transistor may be disposed on the first separation insulating layer. The second switching thin film transistor may include a second semiconductor pattern, a second gate electrode, a second source electrode and a second drain electrode. A driving thin film transistor may be spaced apart from the first switching thin film transistor and the second switching thin film transistor. The driving thin film transistor may include a driving semiconductor pattern, a driving gate electrode, a driving source electrode and a driving drain electrode. A first light-blocking pattern may be disposed between the first gate insulating layer and the first separation insulating layer. The first light-blocking pattern may overlap the second semiconductor pattern. A second light-blocking pattern may be disposed between the first separation insulating layer and the driving semiconductor pattern. The second light-blocking pattern may include a conductive material. A second separation insulating layer may be disposed on the second light-blocking pattern and the driving semiconductor pattern. The second separation insulating layer may extend between the first separation insulating layer and the second semiconductor pattern. A second gate insulating layer may be disposed between the driving semiconductor pattern and the driving gate electrode. The second gate insulating layer extends between the second semiconductor pattern and the second gate electrode. A first capacitance between the second light-blocking pattern and the driving semiconductor pattern may be larger than a second capacitance between the driving semiconductor pattern and the driving gate electrode.

A capacitance between the second semiconductor pattern and the second gate electrode may be the same as the second capacitance.

The second light-blocking pattern may be electrically connected to the driving source electrode.

The first light-blocking pattern may be electrically connected to the second gate electrode.

A storage capacitor being spaced apart from the first switching thin film transistor, the second switching thin film transistor and the driving thin film transistor may be disposed on the first separation insulating layer. The storage capacitor may have a stacked structure of a capacitor lower electrode and a capacitor upper electrode.

The capacitor lower electrode may include the same material as the second light-blocking pattern. The capacitor upper electrode may include the same material as the driving gate electrode. The second separation insulating layer and the second gate insulating layer may extend between the capacitor lower electrode and the capacitor upper electrode.

In one or more example embodiments, there is provided a display apparatus comprising a device substrate. A first insulating layer may be disposed on the device substrate. A light-blocking pattern may be disposed on the first insulating layer. A second insulating layer may be disposed on the light-blocking pattern. A driving thin film transistor may be disposed on the second insulating layer. The driving thin film transistor may include a driving semiconductor pattern, a driving gate electrode, a driving source electrode and a driving drain electrode. The driving drain electrode of the driving thin film transistor may be electrically connected to a light-emitting device. A distance between the light-blocking pattern and the driving semiconductor pattern may be smaller than a distance between the device substrate and the light-blocking pattern.

A gate insulating layer may be disposed between the driving semiconductor pattern and the driving gate electrode of the driving thin film transistor. The driving semiconductor pattern may be disposed between the light-blocking pattern and the driving gate electrode. A thickness of the second insulating layer may be smaller than a thickness of the gate insulating layer.

The light-blocking pattern may include a material stably coupling with hydrogen. The light-blocking pattern may include titanium (Ti).

The driving gate electrode may have a stacked structure of a first driving gate and a second driving gate. The first driving gate may include the same material as the light-blocking pattern. The second driving gate may have a resistance lower than the first driving gate.

The driving source electrode may be electrically connected to the light-blocking pattern.

The driving semiconductor pattern may include a source region and a drain region, which are doped with conductive impurities.

In one or more example embodiments, there is provided a display apparatus in which at least one of thin film transistors in each pixel area includes an oxide semiconductor.

Other apparatuses, devices, methods, features and advantages will be, or will become, apparent to one with skill in the art upon examination of the following figures and detailed description. It is intended that all such additional apparatuses, devices, methods, features and advantages be included within this description, be within the scope of the present disclosure, and be protected by the following claims. Nothing in this section should be taken as a limitation on those claims. Further aspects and advantages are discussed below in conjunction with embodiments of the disclosure.

It is to be understood that both the foregoing description and the following description of the present disclosure are exemplary and explanatory, and are intended to provide further explanation of the disclosure as claimed.

BRIEF DESCRIPTION OF THE DRAWINGS

The accompanying drawings, which are included to provide a further understanding of the present disclosure, are incorporated in and constitute a part of this disclosure, illustrate embodiments of the present disclosure, and together with the description serve to explain principles of the present disclosure. In the drawings:

FIGS. 5 and 6 are views showing the display apparatus according to another example embodiment of the present disclosure, respectively.

DETAILED DESCRIPTION OF THE INVENTION

Figures 1, 2:
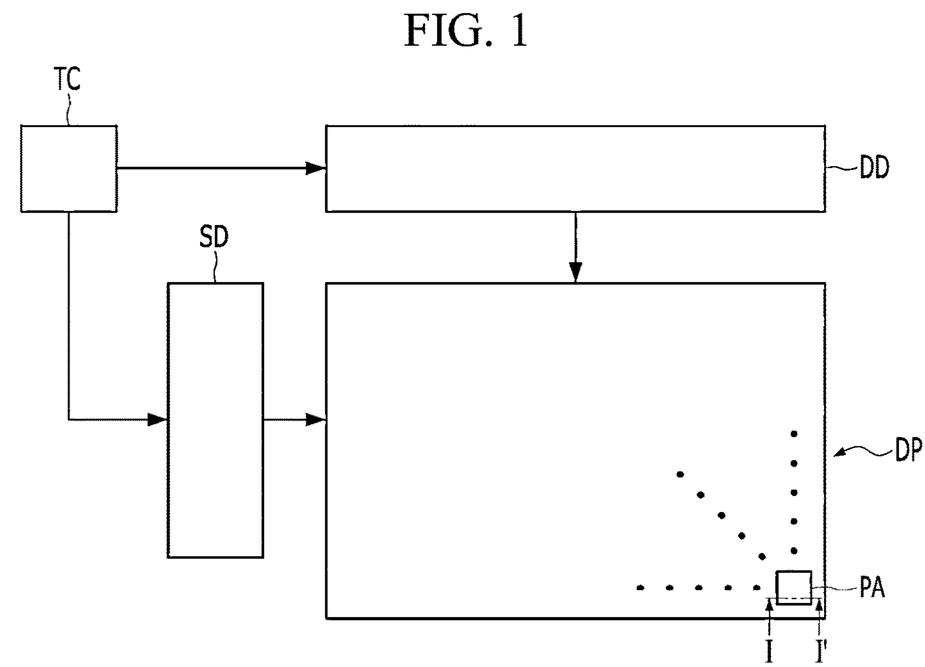
FIG. 1 is a view schematically showing a display apparatus according to an example embodiment of the present disclosure.
FIG. 2 is an example of a cross-section according to I-I' of FIG. 1.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to enable any person skilled in the art to make, use and practice the technical features of the present disclosure, and the present disclosure may be embodied in other forms and is not limited to the embodiments described below.

Reference is now made in detail to embodiments of the present disclosure, examples of which may be illustrated in the accompanying drawings. In the following description, when a detailed description of well-known functions or configurations may unnecessarily obscure aspects of the present disclosure, the detailed description thereof may be omitted. The progression of processing steps and/or operations described is an example; however, the sequence of steps and/or operations is not limited to that set forth herein and may be changed, with the exception of steps and/or operations necessarily occurring in a particular order.

Like reference numerals refer to like elements throughout unless stated otherwise. In one or more aspects, identical elements (or elements with identical names) in different drawings may have the same or substantially the same functions and properties unless stated otherwise. Names of the respective elements used in the following explanations are selected only for convenience and may be thus different from those used in actual products.

Advantages and features of the present disclosure, and implementation methods thereof, are clarified through following embodiments described with reference to the accompanying drawings. The present disclosure may, however, be embodied in different forms and should not be construed as limited to the embodiments set forth herein. Rather, these embodiments are provided so that this disclosure is thorough and complete and fully conveys the scope of the present disclosure to those skilled in the art. Furthermore, the present disclosure is only defined by claims and their equivalents.

The shapes, sizes, areas, ratios, angles, numbers, and the like disclosed in the drawings for describing embodiments of the present disclosure are merely examples, and thus, the present disclosure is not limited to the illustrated details.

When the term “comprise,” “have,” “include,” “contain,” “constitute,” “make up of,” “formed of,” or the like is used, one or more other elements may be added unless a term such as “only” or the like is used. The terms used in the present disclosure are merely used in order to describe particular embodiments, and are not intended to limit the scope of the present disclosure. The terms of a singular form may include plural forms unless the context clearly indicates otherwise. The word “exemplary” is used to mean serving as an example or illustration. Any implementation described herein as an “example” is not necessarily to be construed as preferred or advantageous over other implementations.

In construing an element, the element is construed as including an error or tolerance range even where no explicit description of such an error or tolerance range is provided.

Where positional relationships are described, for example, where the positional relationship between two parts is described using “on,” “over,” “under,” “above,” “below,” “beneath,” “near,” “close to,” or “adjacent to,” “beside,” “next to,” or the like, one or more other parts may be located between the two parts unless a more limiting term, such as “immediate(ly),” “direct(ly),” or “close(ly),” is used. For example, when a structure is described as being positioned “on,” “over,” “under,” “above,” “below,” “beneath,” “near,” “close to,” or “adjacent to,” “beside,” or “next to” another structure, this description should be construed as including a case in which the structures contact each other as well as a case in which one or more additional structures are disposed or interposed therebetween. Furthermore, the terms “front,” “rear,” “back,” “left,” “right,” “top,” “bottom,” “downward,” “upward,” “upper,” “lower,” “up,” “down,” “column,” “row,” “vertical,” “horizontal,” and the like refer to an arbitrary frame of reference.

In describing a temporal relationship, when the temporal order is described as, for example, “after,” “subsequent,” “next,” “before,” “preceding,” “prior to,” or the like, a case that is not continuous or not sequential may be included unless a more limiting term, such as “just,” “immediate(ly),” or “direct(ly),” is used.

It is understood that, although the term “first,” “second,” or the like may be used herein to describe various elements, these elements should not be limited by these terms. These terms are only used to distinguish one element from another. For example, a first element could be a second element, and, similarly, a second element could be a first element, without departing from the scope of the present disclosure. Furthermore, he first element, the second element, and the like may be arbitrarily named according to the convenience of those skilled in the art without departing from the scope of the present disclosure.

In describing elements of the present disclosure, the terms “first,” “second,” “A,” “B,” “(a),” “(b),” or the like may be used. These terms are intended to identify the corresponding element(s) from the other element(s), and these are not used to define the essence, basis, order, or number of the elements.

For the expression that an element or layer is “connected,” “coupled,” or “adhered” to another element or layer, the element or layer can not only be directly connected, coupled, or adhered to another element or layer, but also be indirectly connected, coupled, or adhered to another element or layer with one or more intervening elements or layers disposed or interposed between the elements or layers, unless otherwise specified.

For the expression that an element or layer “contacts,” “overlaps,” or the like with another element or layer, the element or layer can not only directly contact, overlap, or the like with another element or layer, but also indirectly contact, overlap, or the like with another element or layer with one or more intervening elements or layers disposed or interposed between the elements or layers, unless otherwise specified.

The term “at least one” should be understood as including any and all combinations of one or more of the associated listed items. For example, the meaning of "at least one of a first item, a second item, and a third item" denotes the combination of items proposed from two or more of the first item, the second item, and the third item as well as only one of the first item, the second item, or the third item.

The expression of a first element, a second elements "and/or" a third element should be understood as one of the first, second and third elements or as any or all combinations of the first, second and third elements. By way of example, A, B and/or C can refer to only A; only B; only C; any or some combination of A, B, and C; or all of A, B, and C.

In one or more aspects, the terms "between" and "among" may be used interchangeably simply for convenience. For example, an expression "between a plurality of elements" may be understood as between a plurality of elements or among a plurality of elements. For example, an expression "among a plurality of elements" may be understood as between a plurality of elements or among a plurality of elements. In one or more examples, the number of elements may be two. In one or more examples, the number of elements may be more than two.

Features of various embodiments of the present disclosure may be partially or wholly coupled to or combined with each other and may be variously inter-operated, linked or driven together. The embodiments of the present disclosure may be carried out independently from each other or may be carried out together in a co-dependent or related relationship. In one or more aspects, the components of each apparatus according to various embodiments of the present disclosure are operatively coupled and configured.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Hereinafter, apparatus, devices, structures and methods according to example embodiments of the present disclosure may be described in detail with reference to the accompanying drawings. In adding reference numerals to elements of each of the drawings, although the same elements may be illustrated in other drawings, like reference numerals may refer to like elements unless stated otherwise. In addition, for convenience of description, a scale, size, and thickness of each of the elements illustrated in the accompanying drawings may differ from an actual scale, size, and thickness, and thus, embodiments of the present disclosure are not limited to a scale, size, and thickness illustrated in the drawings.

Figures 3A, 3B:
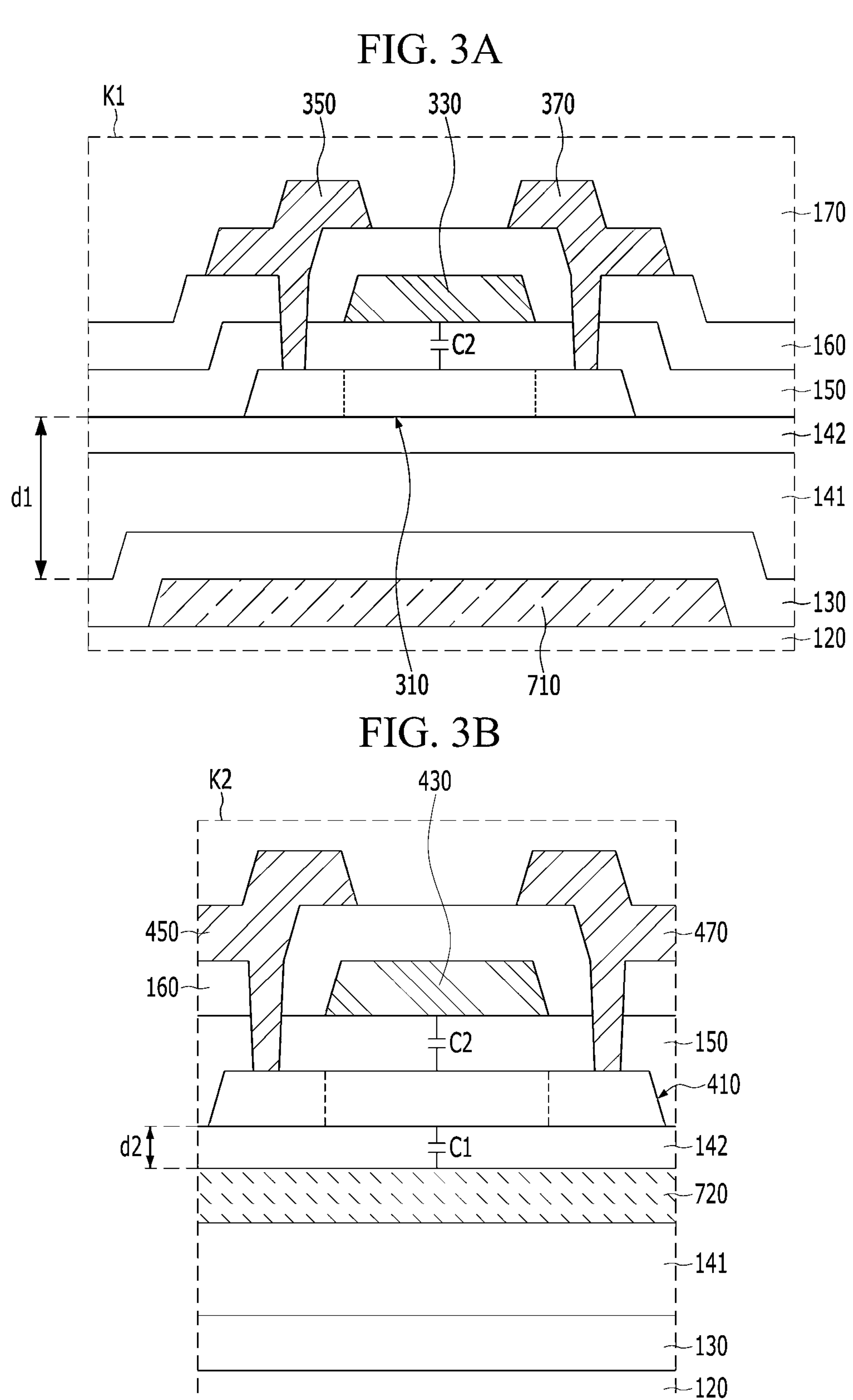
FIG. 3A is an example of an enlarged view of K1 region in FIG. 2.
FIG. 3B is an example of an enlarged view of K2 region in FIG. 2.

FIG. 1 is a view schematically showing a display apparatus according to an example embodiment of the present disclosure. FIG. 2 is an example of a cross-section according to I-I' of FIG. 1. FIG. 3A is an example of an enlarged view of K1 region in FIG. 2. FIG. 3B is an example of an enlarged view of K2 region in FIG. 2.

Referring to FIGS. 1, 2, 3A and 3B, the display apparatus according to the example embodiment of the present disclosure may include a display panel DP and driving parts SD, DD and TC. The display panel DP may realize an image being provided to a user. For example, the display panel DP may include a plurality of pixel areas PA. The driving parts SD, DD and TC may provide various signals for realizing the image to each pixel area PA of the display panel DP. For example, the driving parts SD, DD and TC may include a scan driver SD, a data driver DD and a timing controller TC.

The scan driver SD may sequentially apply a scan signal to each pixel area PA of the display panel DP through scan lines. The data driver DD may apply a data signal to each pixel area PA of the display panel DP through data lines. The timing controller TC may control the operation of the scan driver SD and the operation of the data driver DD. For example, the timing controller TC may supply clock signals, reset clock signals and start signals to the scan driver SD, and supply a digital video data and a source timing control signal to the data driver DD.

Each of the pixel areas PA in the display panel DP may realize (or produce) a specific color. For example, a light-emitting device 500 may be disposed in each pixel area PA. The light-emitting device 500 may emit light displaying a specific color. For example, the light-emitting device 500 may include a first electrode 510, a light-emitting layer 520 and a second electrode 530, which are sequentially stacked.

The first electrode 510 may include a conductive material. The first electrode 510 may include a material having a high reflectance. For example, the first electrode 510 may include a metal, such as aluminum (Al) and/or silver (Ag). The first electrode 510 may have a multi-layer structure. For example, the first electrode 510 may have a structure in which a reflective electrode made of a metal is interposed between transparent electrodes made of transparent conductive material, such as indium tin oxide (ITO) and/or indium zinc oxide (IZO).

The light-emitting layer 520 may generate light having luminance corresponding to a voltage difference between the first electrode 510 and the second electrode 530. For example, the light-emitting layer 520 may include an emission material layer (EML) having an emission material. The emission material may include an organic material, an inorganic material or a hybrid material. For example, the display panel DP of the display apparatus according to the example embodiment of the present disclosure may be an organic light-emitting display apparatus including an organic emission material. The light-emitting layer 520 may have a multi-layer structure. For example, the light-emitting layer 520 may further include at least one of a hole injection layer (HIL), a hole transport layer (HTL), an electron transport layer (ETL) and an electron injection layer (EIL). Thus, in the display panel DP of the display apparatus according to the example embodiment of the present disclosure, the emission efficiency of the light-emitting layer 520 in each pixel area PA may be improved.

The second electrode 530 may include a conductive material. The second electrode 530 may include a material different from the first electrode 510. The transmittance of the second electrode 530 may be higher than the transmittance of the first electrode 510. For example, the second electrode 530 may include a transparent conductive material, such as ITO and/or IZO. Thus, in the display panel DP of the display apparatus according to the example embodiment of the present disclosure, the light generated by the light-emitting layer 520 of each pixel area PA may be emitted to the outside through the second electrode 530 of the corresponding pixel area PA.

The light-emitting device 500 of each pixel area PA may be supported by a device substrate 100. The device substrate 100 may have a multi-layer structure. For example, the device substrate 100 may have a stacked structure of a first substrate layer 101, a substrate insulating layer 102 and a second substrate layer 103. The second substrate layer 103 may include the same material as the first substrate layer 101. For example, the first substrate layer 101 and the second substrate layer 103 may include a polymer material, such as polyimide (PI). The substrate insulating layer 102 may include an insulating material. For example, the substrate insulating layer 102 may include an inorganic insulating material, such as silicon oxide (SiO) and/or silicon nitride (SiN). Thus, in the display panel DP of the display apparatus according to the example embodiment of the present disclosure, a damage to the device substrate 100 and/or the light-emitting device 500 due to external impact and bending may be prevented.

A driving circuit may be disposed on each pixel area PA of the device substrate 100. The driving circuit of each pixel area PA may be electrically connected to the driving parts SD, DD and TC. For example, the driving circuit of each pixel area PA may be electrically connected to one of the scan lines and one of the data lines. The driving circuit of each pixel area PA may generate a driving current corresponding to the data signal according to the scan signal. For example, the driving circuit of each pixel area PA may include a first switching thin film transistor 200, a second switching thin film transistor 300 and a driving thin film transistor 400.

The first switching thin film transistor 200 may include a first semiconductor pattern 210, a first gate electrode 230, a first source electrode 250 and a first drain electrode 270, which are disposed on the device substrate 100.

The first semiconductor pattern 210 may be disposed close to the device substrate 100. The first semiconductor pattern 210 may include a semiconductor material. For example, the first semiconductor pattern 210 may include a low-temperature poly-Si (LTPS). The first semiconductor pattern 210 may include a first source region, a first channel region and a first drain region. The first channel region may be disposed between the first source region and the first drain region. The first source region and the first drain region may have a resistance lower than the first channel region. For example, the first source region and the first drain region may include conductive impurities.

The first gate electrode 230 may be disposed on the first semiconductor pattern 210. The first gate electrode 230 may include a conductive material. For example, the first gate electrode 230 may include a metal, such as aluminum (Al), titanium (Ti), copper (Cu), chrome (Cr), molybdenum (Mo) and/or tungsten (W). The first gate electrode 230 may be insulated from the first semiconductor pattern 210. For example, a first gate insulating layer 120 extending between the first semiconductor pattern 210 and the first gate electrode 230 may be disposed on the device substrate 100. The first gate insulating layer 120 may include an insulating material. For example, the first gate insulating layer 120 may include an inorganic insulating material, such as silicon oxide (SiO) and/or silicon nitride (SiN). The first gate insulating layer 120 may extend beyond the first semiconductor pattern 210. For example, a side of the first semiconductor pattern 210 may be covered by the first gate insulating layer 120.

The first gate electrode 230 may overlap the first channel region of the first semiconductor pattern 210. For example, the first channel region of the first semiconductor pattern 210 may have an electrical conductivity corresponding to a voltage applied to the first gate electrode 230.

The first source electrode 250 may include a conductive material. For example, the first source electrode 250 may include a metal, such as aluminum (Al), titanium (Ti), copper (Cu), chrome (Cr), molybdenum (Mo) and/or tungsten (W). The first source electrode 250 may be insulated from the first gate electrode 230. The first source electrode 250 may include a material different from the first gate electrode 230. The first source electrode 250 may be disposed on a layer different from the first gate electrode 230. For example, a first interlayer insulating layer 130 extending between the first gate electrode 230 and the first source electrode 250 may be disposed on the first gate insulating layer 120. The first interlayer insulating layer 130 may include an insulating material. For example, the first interlayer insulating layer 130 may include an inorganic insulating material made of silicon nitride (SiN). The first interlayer insulating layer 130 may extend beyond the first semiconductor pattern 210 and the first gate electrode 230. For example, a side of the first gate electrode 230 may be covered by the first interlayer insulating layer 130.

The first source electrode 250 may be electrically connected to the first source region of the first semiconductor pattern 210. For example, the first gate insulating layer 120 and the first interlayer insulating layer 130 may include a first source contact hole partially exposing the first source region of the first semiconductor pattern 210. The first source electrode 250 may be in direct contact with the first source region of the first semiconductor pattern 210 through the first source contact hole.

The first drain electrode 270 may include a conductive material. For example, the first drain electrode 270 may include a metal, such as aluminum (Al), titanium (Ti), copper (Cu), chrome (Cr), molybdenum (Mo) and/or tungsten (W). The first drain electrode 270 may be insulated from the first gate electrode 230. The first drain electrode 270 may include a material different from the first gate electrode 230. The first drain electrode 270 may be disposed on a layer different from the first gate electrode 230. For example, the first interlayer insulating layer 130 may extend between the first gate electrode 230 and the first drain electrode 270. The first drain electrode 270 may be disposed on the same layer as the first source electrode 250. For example, the first drain electrode 270 may include the same material as the first source electrode 250.

The first drain electrode 270 may be electrically connected to the first drain region of the first semiconductor pattern 210. For example, the first gate insulating layer 120 and the first interlayer insulating layer 130 may include a first drain contact hole partially exposing the first drain region of the first semiconductor pattern 210. The first drain electrode 270 may be in direct contact with the first drain region of the first semiconductor pattern 210.

The second switching thin film transistor 300 may be spaced away (or apart) from the first switching thin film transistor 200. A structure of the second switching thin film transistor 300 may be the same as a structure of the first switching thin film transistor 200. For example, the second switching thin film transistor 300 may include a second semiconductor pattern 310, a second gate electrode 330, a second source electrode 350 and a second drain electrode 370, which are disposed on the device substrate 100.

The second semiconductor pattern 310 may include a semiconductor material. The second semiconductor pattern 310 may include a material different from the first semiconductor pattern 210. For example, the second semiconductor pattern 310 may include an oxide semiconductor, such as indium gallium zinc oxide (IGZO). The second semiconductor pattern 310 may include a second source region, a second channel region and a second drain region. The second channel region may be disposed between the second source region and the second drain region. The second source region and the second drain region may have a resistance lower than the second channel region. For example, the second source region and the second drain region may include a conductorized region of an oxide semiconductor.

The second semiconductor pattern 310 may be disposed on a layer different from the first semiconductor pattern 210. For example, a separation insulating layer 140 may be disposed on the first interlayer insulating layer 130, and the second semiconductor pattern 310 may be disposed on the separation insulating layer 140. The separation insulating layer 140 may include an insulating material. The separation insulating layer 140 may have a multi-layer structure. For example, the separation insulating layer 140 may have a stacked structure of a first separation insulating layer 141 and a second separation insulating layer 142. The second separation insulating layer 142 may include the same material as the first separation insulating layer 141. For example, the first separation insulating layer 141 and the second separation insulating layer 142 may include an inorganic insulating material made of silicon oxide (SiO). Thus, in the display panel DP of the display apparatus according to the example embodiment of the present disclosure, a damage to the first semiconductor pattern 210 due to a process of forming the second semiconductor pattern 310 may be prevented. In addition, in the display panel DP of the display apparatus according to the example embodiment of the present disclosure, the unintended conductorization of the second semiconductor pattern 310 in each pixel area PA due to hydrogen emitted from the separation insulating layer 140 may be prevented. In one or more aspects, the term "conductorization" may refer to making at least a part of a layer (e.g., a semiconductor layer) conductive.

The second gate electrode 330 may be disposed on the second semiconductor pattern 310. The second gate electrode 330 may include a conductive material. For example, the second gate electrode 330 may include a metal, such as aluminum (Al), titanium (Ti), copper (Cu), chrome (Cr), molybdenum (Mo) and/or tungsten (W). The second gate electrode 330 may be insulated from the second semiconductor pattern 310. For example, a second gate insulating layer 150 extending between the second semiconductor pattern 310 and the second gate electrode 330 may be disposed on the separation insulating layer 140. The second gate insulating layer 150 may include an insulating material. For example, the second gate insulating layer 150 may be an inorganic insulating layer made of an inorganic insulating material, such as silicon oxide (SiO). The second gate insulating layer 150 may extend beyond the second semiconductor pattern 310. For example, a side of the second semiconductor pattern 310 may be covered by the second gate insulating layer 150.

The second gate electrode 330 may overlap the second channel region of the second semiconductor pattern 310. For example, the second channel region of the second semiconductor pattern 310 may have an electrical conductivity corresponding to a voltage applied to the second gate electrode 330.

The second source electrode 350 may include a conductive material. For example, the second source electrode 350 may include a metal, such as aluminum (Al), titanium (Ti), copper (Cu), chrome (Cr), molybdenum (Mo) and/or tungsten (W). The second source electrode 350 may be insulated from the second gate electrode 330. The second source electrode 350 may include a material different from the second gate electrode 330. The second source electrode 350 may be disposed on a layer different from the second gate electrode 330. For example, a second interlayer insulating layer 160 extending between the second gate electrode 330 and the second source electrode 350 may be disposed on the device substrate 100. The second interlayer insulating layer 160 may include an insulating material. For example, the second interlayer insulating layer 160 may be an inorganic insulating layer made of an inorganic insulating material, such as silicon nitride (SiN) and/or silicon oxide (SiO). The second interlayer insulating layer 160 may extend beyond the second semiconductor pattern 310 and the second gate electrode 330. For example, a side of the second gate electrode 330 may be covered by the second interlayer insulating layer 160.

The second source electrode 350 may include the same material as the first source electrode 250 and the first drain electrode 270. The first source electrode 250 and the first drain electrode 270 may be disposed on the same layer as the second source electrode 350. For example, the first source electrode 250 and the first drain electrode 270 may be disposed on the second interlayer insulating layer 160. The first source contact hole and the first drain contact hole may penetrate the separation insulating layer 140, the second gate insulating layer 150 and the second interlayer insulating layer 160.

The second source electrode 350 may be electrically connected to the second source region of the second semiconductor pattern 310. For example, the second gate insulating layer 150 and the second interlayer insulating layer 160 may include a second source contact hole partially exposing the second source region of the second semiconductor pattern 310. The second source electrode 350 may be in direct contact with the second source region of the second semiconductor pattern 310 through the second source contact hole.

The second drain electrode 370 may include a conductive material. For example, the second drain electrode 370 may include a metal, such as aluminum (Al), titanium (Ti), copper (Cu), chrome (Cr), molybdenum (Mo) and/or tungsten (W). The second drain electrode 370 may be insulated from the second gate electrode 330. The second drain electrode 370 may include a material different from the second gate electrode 330. The second drain electrode 370 may be disposed on a layer different from the second gate electrode 330. For example, the second drain electrode 370 may be disposed on the second interlayer insulating layer 160. The second drain electrode 370 may be disposed on the same layer as the second source electrode 350. For example, the second drain electrode 370 may include the same material as the second source electrode 350.

The second drain electrode 370 may be electrically connected to the second drain region of the second semiconductor pattern 310. For example, the second gate insulating layer 150 and the second interlayer insulating layer 160 may include a second drain contact hole partially exposing the second drain region of the second semiconductor pattern 310. The second drain electrode 370 may be in direct contact with the second drain region of the second semiconductor pattern 310 through the second drain contact hole.

The driving thin film transistor 400 may be spaced away (or apart) from the first switching thin film transistor 200 and the second switching thin film transistor 300. The driving thin film transistor 400 may have the same structure as the second switching thin film transistor 300. For example, the driving thin film transistor 400 may include a driving semiconductor pattern 410, a driving gate electrode 430, a driving source electrode 450 and a driving drain electrode 470, which are disposed on the separation insulating layer 140.

The driving semiconductor pattern 410 may include a semiconductor material. For example, the driving semiconductor pattern 410 may include an oxide semiconductor, such as IGZO. The driving semiconductor pattern 410 may include the same material as the second semiconductor pattern 310. For example, the driving semiconductor pattern 410 may be disposed on the same layer as the second semiconductor pattern 310. The driving semiconductor pattern 410 may be formed simultaneously with the second semiconductor pattern 310. The driving semiconductor pattern 410 may include a third source region, a third channel region and a third drain region. The third channel region may be disposed between the third source region and the third drain region. The third source region and the third drain region may have a resistance lower than the third channel region. For example, the third source region and the third drain region may include a conductorized region of an oxide semiconductor. The third channel region of the driving semiconductor pattern 410 may have the same resistance as the second channel region of the second semiconductor pattern 310. For example, the third source region and the third drain region of the driving semiconductor pattern 410 may have the same resistance as the second source region and the second drain region of the second semiconductor pattern 310.

The driving gate electrode 430 may be disposed on the driving semiconductor pattern 410. The driving gate electrode 430 may include a conductive material. For example, the driving gate electrode 430 may include a metal, such as aluminum (Al), titanium (Ti), copper (Cu), chrome (Cr), molybdenum (Mo) and/or tungsten (W). The driving gate electrode 430 may be insulated from the driving semiconductor pattern 410. For example, the second gate insulating layer 150 may extend between the driving semiconductor pattern 410 and the driving gate electrode 430. A side of the driving semiconductor pattern 410 may be covered by the second gate insulating layer 150. The driving gate electrode 430 may include the same material as the second gate electrode 330 of the second switching thin film transistor 300.

The driving gate electrode 430 may overlap the third channel region of the driving semiconductor pattern 410. For example, the third channel region of the driving semiconductor pattern 410 may have an electrical conductivity corresponding to a voltage applied to the driving gate electrode 430.

The driving source electrode 450 may include a conductive material. For example, the driving source electrode 450 may include a metal, such as aluminum (Al), titanium (Ti), copper (Cu), chrome (Cr), molybdenum (Mo) and/or tungsten (W). The driving source electrode 450 may be insulated from the driving gate electrode 430. The driving source electrode 450 may include a material different from the driving gate electrode 430. The driving source electrode 450 may be disposed on a layer different from the driving gate electrode 430. For example, the second interlayer insulating layer 160 may extend between the driving gate electrode 430 and the driving source electrode 450. The driving source electrode 450 may include the second source electrode 350 and the second drain electrode 370. For example, the driving source electrode 450 may be disposed on the same layer as the second source electrode 350 and the second drain electrode 370.

The driving source electrode 450 may be electrically connected to the third source region of the driving semiconductor pattern 410. For example, the second gate insulating layer 150 and the second interlayer insulating layer 160 may include a third source contact hole partially exposing the third source region of the driving semiconductor pattern 410. The driving source electrode 450 may be in direct contact with the third source region of the driving semiconductor pattern 410 through the third source contact hole.

The driving drain electrode 470 may include a conductive material. For example, the driving drain electrode 470 may include a metal, such as aluminum (Al), titanium (Ti), copper (Cu), chrome (Cr), molybdenum (Mo) and/or tungsten (W). The driving drain electrode 470 may be insulated from the driving gate electrode 430. The driving drain electrode 470 may include a material different from the driving gate electrode 430. The driving drain electrode 470 may be disposed on a layer different from the driving gate electrode 430. For example, the second interlayer insulating layer 160 may extend between the driving gate electrode 430 and the driving drain electrode 470. The driving drain electrode 470 may be disposed on the same layer as the driving source electrode 450. For example, the driving drain electrode 470 may include the same material as the driving source electrode 450.

The driving drain electrode 470 may be electrically connected to the third drain region of the driving semiconductor pattern 410. For example, the second gate insulating layer 150 and the second interlayer insulating layer 160 may include a third drain contact hole partially exposing the driving drain region of the driving semiconductor pattern 410. The driving drain electrode 470 may be in direct contact with the third drain region of the driving semiconductor pattern 410 through the driving drain contact hole.

In each of the driving circuits, the first switching thin film transistor 200 and/or the second switching thin film transistor 300 may transmit the data signal to the driving thin film transistor 400 according to the scan signal. For example, in each pixel area PA, the first gate electrode 230 of the first switching thin film transistor 200 may be electrically connected to one of the scan lines, the first source electrode 250 of the first switching thin film transistor 200 may be electrically connected to one of the data lines. In each driving circuit, the second switching thin film transistor 300 which is not connected to one of the data lines may be used as an internal compensation circuit to compensate the signal delay according to the location of the pixel areas PA. For example, in each pixel area PA, the second source electrode 350 of the second switching thin film transistor 300 may be electrically connected to one of reference voltage supply lines. The driving thin film transistor 400 of each driving circuit may generate a driving current corresponding to the data signal. For example, in each pixel area PA, the driving gate electrode 430 of the driving thin film transistor 400 may be electrically connected to the first drain electrode 270 of the first switching thin film transistor 200, and the driving source electrode 450 of the driving thin film transistor 400 may be electrically connected to one of power voltage supply lines.

The scan lines, the data lines, the reference voltage supply lines and the power voltage supply lines may be formed by a process of forming the first switching thin film transistor 200, the second switching thin film transistor 300 and the driving thin film transistor 400 in each pixel area PA. For example, the scan lines may be disposed on the same layer as the first gate electrode 230 of each driving circuit, and the data lines, the reference voltage supply lines and the power voltage supply lines may be disposed on the same layer as the first source electrode 250 and the first drain electrode 270 of each driving circuit. The scan lines may include the same material as the first gate electrode 230 of each driving circuit. For example, the scan lines may be disposed between the first gate insulating layer 120 and the first interlayer insulating layer 130. The data lines, the reference voltage supply lines and the power voltage supply lines may include the same material as the first source electrode 250, the first drain electrode 270, the second source electrode 350, the second drain electrode 370, the driving source electrode 450 and the driving drain electrode 470 of each driving circuit. For example, the data lines, the reference voltage supply lines and the power voltage supply lines may be disposed on the second interlayer insulating layer 160.

A buffer insulating layer 110 may be disposed between the device substrate 100 and each driving circuit. The buffer insulating layer 110 may prevent pollution due to the device substrate 100 in a process of forming each driving circuit. For example, an upper surface of the device substrate 100 toward the first switching thin film transistor 200, the second switching thin film transistor 300 and the driving thin film transistor 400 of each driving circuit may be completely covered by the buffer insulating layer 110. The buffer insulating layer 110 may include an insulating material. For example, the buffer insulating layer 110 may include an inorganic insulating material, such as silicon oxide (SiO) and/or silicon nitride (SiN). The buffer insulating layer 110 may have a multi-layer structure. For example, the buffer insulating layer 110 may have a stacked structure of a first buffer layer 111 and a second buffer layer 112. The second buffer layer 112 may include a material different from the first buffer layer 111. For example, the buffer insulating layer 110 may have a stacked structure of an inorganic insulating layer made of silicon oxide (SiO) and an inorganic insulating layer made of silicon nitride (SiN).

The light-emitting device 500 of each pixel area PA may be electrically connected to the driving thin film transistor 400 of the driving circuit in the corresponding pixel area PA. For example, the first electrode 510 of the light-emitting device 500 in each pixel area PA may be electrically connected to the driving drain electrode 470 of the driving thin film transistor 400 in the corresponding pixel area PA. The first electrode 510 of each pixel area PA may be disposed on a layer different from the driving drain electrode 470 of the corresponding pixel area PA. For example, an over-coat layer 170 covering the first source electrode 250, the first drain electrode 270, the second source electrode 350, the second drain electrode 370, the driving source electrode 450 and the driving drain electrode 470 may be disposed on the second interlayer insulating layer 160, and the light-emitting device 500 of each pixel area PA may be disposed on the over-coat layer 170. The over-coat layer 170 may include an insulating material. The over-coat layer 170 may include a material different from the second interlayer insulating layer 160. For example, the over-coat layer 170 may be an organic insulating layer made of an organic insulating material. A thickness difference due to the driving circuit of each pixel area PA may be removed by the over-coat layer 170. For example, the over-coat layer 170 may remove a thickness difference due to the first switching thin film transistor 200, the second switching thin film transistor 300 and the driving thin film transistor 400 of each pixel area PA. An upper surface of the over-coat layer 170 opposite to the device substrate 100 may be a flat surface.

The first electrode 510 of each pixel area PA may be electrically connected to the driving drain electrode 470 of the corresponding pixel area PA by penetrating the over-coat layer 170. For example, the over-coat layer 170 may include electrode contact holes partially exposing the driving drain electrode 470 of each pixel area PA. The first electrode 510 of each pixel area PA may be in direct contact with the driving drain electrode 470 of the corresponding pixel area PA through one of the electrode contact holes.

The light-emitting device 500 of each pixel area PA may emit light having luminance different from the light-emitting device 500 of an adjacent pixel area PA. For example, the first electrode 510 of the light-emitting device 500 in each pixel area PA may be spaced away (or apart) from the first electrode 510 of the light-emitting device 500 in an adjacent pixel area PA. A bank insulating layer 180 may be disposed on the over-coat layer 170 between the first electrodes 510 of an adjacent two-pixel area PA. The bank insulating layer 180 may include an insulating material. For example, the bank insulating layer 180 may be an organic insulating layer made of an organic insulating material. The bank insulating layer 180 may include a material different from the over-coat layer 170. The first electrode 510 of the light-emitting device 500 in each pixel area PA may be insulated from the first electrode 510 of the light-emitting device 500 in an adjacent pixel area PA by the bank insulating layer 180. For example, the bank insulating layer 180 may cover an edge of the first electrode 510 in each pixel area PA. The light-emitting layer 520 and the second electrode 530 in each pixel area PA may be sequentially stacked on a portion of the corresponding first electrode 510 exposed by the bank insulating layer 180.

The light emitted from the light-emitting device 500 of each pixel area PA may display a color different from the light emitted from the light-emitting device 500 of an adjacent pixel area PA. For example, the light-emitting layer 520 of each pixel area PA may be spaced away (or apart) from the light-emitting layer 520 of an adjacent pixel area PA. The light-emitting layer 520 in each pixel area PA may include an end disposed on the bank insulating layer 180. The light-emitting layer 520 of each pixel area PA may be formed individually. For example, the light-emitting layer 520 of each pixel area PA may be formed using a fine metal mask (FMM). A spacer 190 may be disposed on the bank insulating layer 180. The spacer 190 may prevent a damage to the bank insulating layer 180 and the light-emitting layer 520 due to the fine metal mask. The spacer 190 may include an insulating material. For example, the spacer 190 may be an organic insulating layer made of an organic insulating material. The end of the light-emitting layer 520 in each pixel area PA may be spaced away (or apart) from the spacer 190.

A voltage applied to the second electrode 530 of each pixel area PA may be the same as a voltage applied to the second electrode 530 of an adjacent pixel area PA. For example, the second electrode 530 of each pixel area PA may be electrically connected to the second electrode 530 of an adjacent pixel area PA. The second electrode 530 of each pixel area PA may include the same material as the second electrode 530 of an adjacent pixel area PA. For example, the second electrode 530 of each pixel area PA may be in direct contact with the second electrode 530 of an adjacent pixel area PA. The second electrode 530 of each pixel area PA may extend onto the bank insulating layer 180 and the spacer 190. Thus, in the display panel DP of the display apparatus according to the example embodiment of the present disclosure, the luminance of the light emitted from the light-emitting device 500 of each pixel area PA may be controlled by the driving current generated by the driving circuit of the corresponding pixel area PA.

An encapsulating element 600 may be disposed on the light-emitting device 500 of each pixel area PA. The encapsulating element 600 may prevent a damage to the light-emitting device 500 in each pixel area PA due to external impact and moisture. The encapsulating element 600 may include an insulating material. The encapsulating element 600 may have a multi-layer structure. For example, the encapsulating element 600 may include a first encapsulating layer 610, a second encapsulating layer 620 and a third encapsulating layer 630, which are sequentially stacked. The second encapsulating layer 620 may include a material different from the first encapsulating layer 610 and the third encapsulating layer 630. For example, the first encapsulating layer 610 and the third encapsulating layer 630 may be an inorganic insulating layer made of an inorganic insulating material, and the second encapsulating layer 620 may be an organic insulating layer made of an organic insulating material. Thus, in the display panel DP of the display apparatus according to the example embodiment of the present disclosure, a damage to the light-emitting device 500 in each pixel area PA due to the external impact and moisture may be effectively prevented. A thickness difference in the light-emitting device 500 of each pixel area PA may be removed by the second encapsulating layer 620. For example, an upper surface of the encapsulating element 600 opposite to the device substrate 100 may be a flat surface.

The display panel DP of the display apparatus according to the example embodiment of the present disclosure may prevent a change in characteristics of the semiconductor patterns 310 and 410 including an oxide semiconductor due to external light. For example, light-blocking patterns 710 and 720 may be disposed in each pixel area PA. The light-blocking patterns 710 and 720 may block the external light travelling in a direction of the semiconductor patterns 310 and 410 including an oxide semiconductor. For example, the light-blocking patterns 710 and 720 of each pixel area PA may include a first light-blocking pattern 710 between the device substrate 100 and the second semiconductor pattern 310, and a second light-blocking pattern 720 between the device substrate 100 and the driving semiconductor pattern 410.

The first light-blocking pattern 710 may block the external light travelling in a direction of the second semiconductor pattern 310 passing through the device substrate 100. The first light-blocking pattern 710 may have a size larger than the second semiconductor pattern 310. For example, the second semiconductor pattern 310 may overlap a portion of the first light-blocking pattern 710. The first light-blocking pattern 710 may be spaced away (or apart) from the first switching thin film transistor 200 and the driving thin film transistor 400. For example, the first light-blocking pattern 710 may be disposed at the outside of the first switching thin film transistor 200 and the driving thin film transistor 400.

The first light-blocking pattern 710 may include a conductive material. For example, the first light-blocking pattern 710 may include a metal, such as aluminum (Al), titanium (Ti), copper (Cu), chrome (Cr), molybdenum (Mo) and/or tungsten (W). The first light-blocking pattern 710 may be formed by a process of forming the first switching thin film transistor 200. For example, the first light-blocking pattern 710 may be formed simultaneously with the first gate electrode 230. The first light-blocking pattern 710 may include the same material as the first gate electrode 230. The first light-blocking pattern 710 may be disposed on the same layer as the first gate electrode 230. For example, the first light-blocking pattern 710 may be disposed between the first gate insulating layer 120 and the first interlayer insulating layer 130.

The second light-blocking pattern 720 may block the external light travelling in a direction of the driving semiconductor pattern 410 passing through the device substrate 100. The second light-blocking pattern 720 may have a size larger than the driving semiconductor pattern 410. For example, the driving semiconductor pattern 410 may overlap a portion of the second light-blocking pattern 720. The second light-blocking pattern 720 may be spaced away (or apart) from the first switching thin film transistor 200 and the second switching thin film transistor 300. For example, the second light-blocking pattern 720 may be disposed at the outside of the first switching thin film transistor 200 and the second switching thin film transistor 300.

The second light-blocking pattern 720 may include a conductive material. For example, the second light-blocking pattern 720 may include a metal. The second light-blocking pattern 720 may include a material different from the first light-blocking pattern 710. For example, the second light-blocking pattern 720 may include a material capable of blocking the penetration of hydrogen. The second light-blocking pattern 720 may include a material stably coupling with hydrogen. For example, the second light-blocking pattern 720 may include titanium (Ti). Thus, in the display panel DP of the display apparatus according to the example embodiment of the present disclosure, hydrogen remaining between the device substrate 100 and the separation insulating layer 140 due to a process of forming the first semiconductor pattern 210 may not penetrate in the driving semiconductor pattern by the second light-blocking pattern 720. That is, in the display panel DP of the display apparatus according to the example embodiment of the present disclosure, the unintended conductorization of the driving semiconductor pattern 410 in each pixel area PA may be prevented by the second light-blocking pattern 720. Therefore, in the display panel DP of the display apparatus according to the example embodiment of the present disclosure, reliability for the operating characteristics of the driving thin film transistor 400 in each pixel area PA may be improved.

The second light-blocking pattern 720 may be disposed on a layer different from the first light-blocking pattern 710. The second light-blocking pattern 720 may be disposed close to the driving semiconductor pattern 410. For example, the second light-blocking pattern 720 may be disposed between the first separation insulating layer 141 and the second separation insulating layer 142. A distance d2 between the second light-blocking pattern 720 and the driving semiconductor pattern 410 may be smaller than a distance d1 between the first light-blocking pattern 710 and the second semiconductor pattern 310.

A specific voltage may be applied to the second light-blocking pattern 720. The voltage applied to the second light-blocking pattern 720 may be different from the voltage applied to the driving gate electrode 430. For example, the second light-blocking pattern 720 may be electrically connected to the driving source electrode 450. A constant voltage may be applied to the second light-blocking pattern 720, regardless of the voltage applied to the driving gate electrode 430. Thus, in the display panel DP of the display apparatus according to the embodiment of the present invention, a parasitic capacitor having a first capacitance C1 may be formed between the second light-blocking pattern 720 and the driving semiconductor pattern 410 in each pixel area PA. A parasitic capacitor having a second capacitance C2 may be formed between the driving semiconductor pattern 410 and the driving gate electrode 430 in each pixel area PA. In the display panel DP of the display apparatus according to the example embodiment of the present disclosure, the amount of change in the effective gate voltage that affects the driving current applied to the light-emitting device 500 in the pixel area PA may be determined by the following equation. Herein, $\Delta V_{eff}$ denotes the amount of change in the effective gate voltage, $\Delta V_{GAT}$ denotes an amount of change in voltage applied to the driving gate electrode 430, $C_{ACT}$ denotes a capacitance of a parasitic capacitor formed by a voltage applied to the third source region and the third drain region of the driving semiconductor pattern 410.

$$\Delta V_{eff} = \frac{C2}{C2 + C_{ACT} + C1} \times \Delta V_{GAT} \quad \text{[equation]}$$

Referring to the equation, in the display panel DP of the display apparatus according to the example embodiment of the present disclosure, the effective gate voltage that affects the generation of the driving current may be reduced by the parasitic capacitor formed between the second light-blocking pattern 720 and the driving semiconductor pattern 410 in each pixel area PA. In a typical thin film transistor, when the effective gate voltage is reduced, S-factor may be increased and a rate of change in the current according to the applied voltage may be decreased. Here, S-factor refers to the inverse ratio of the amount of current variation according to the gate voltage variation in the ON-OFF transition region of the thin film transistor. In addition, when S-factor of the driving thin film transistor 400 in each pixel area PA of the display panel DP is increased and a rate of change in the current according to the voltage applied to the driving gate electrode 430 is decreased, the occurrence of a spot in low grayscale may be reduced. Thus, the display panel DP of the display apparatus according to the example embodiment of the present disclosure may increase S-factor of the driving thin film transistor 400 in each pixel area PA and may decrease a rate of change in the driving current according to the voltage applied to the driving gate electrode 430 of the driving thin film transistor 400 by forming a parasitic capacitor between the second light-blocking pattern 720 and the driving semiconductor pattern 410 in the corresponding pixel area PA. That is, in the display panel DP of the display apparatus according to the example embodiment of the present disclosure, the characteristics of the driving thin film transistor 400 in each pixel area PA may be controlled, without changing the structure of the first switching thin film transistor 200 and the second switching thin film transistor 300 in the corresponding pixel area PA. Therefore, in the display panel DP of the display apparatus according to the example embodiment of the present disclosure, the occurrence of the spot in low grayscale may be prevented, without changing the characteristics of the first switching thin film transistor 200 and the second switching thin film transistor 300 in each pixel area PA.

Figure 4:
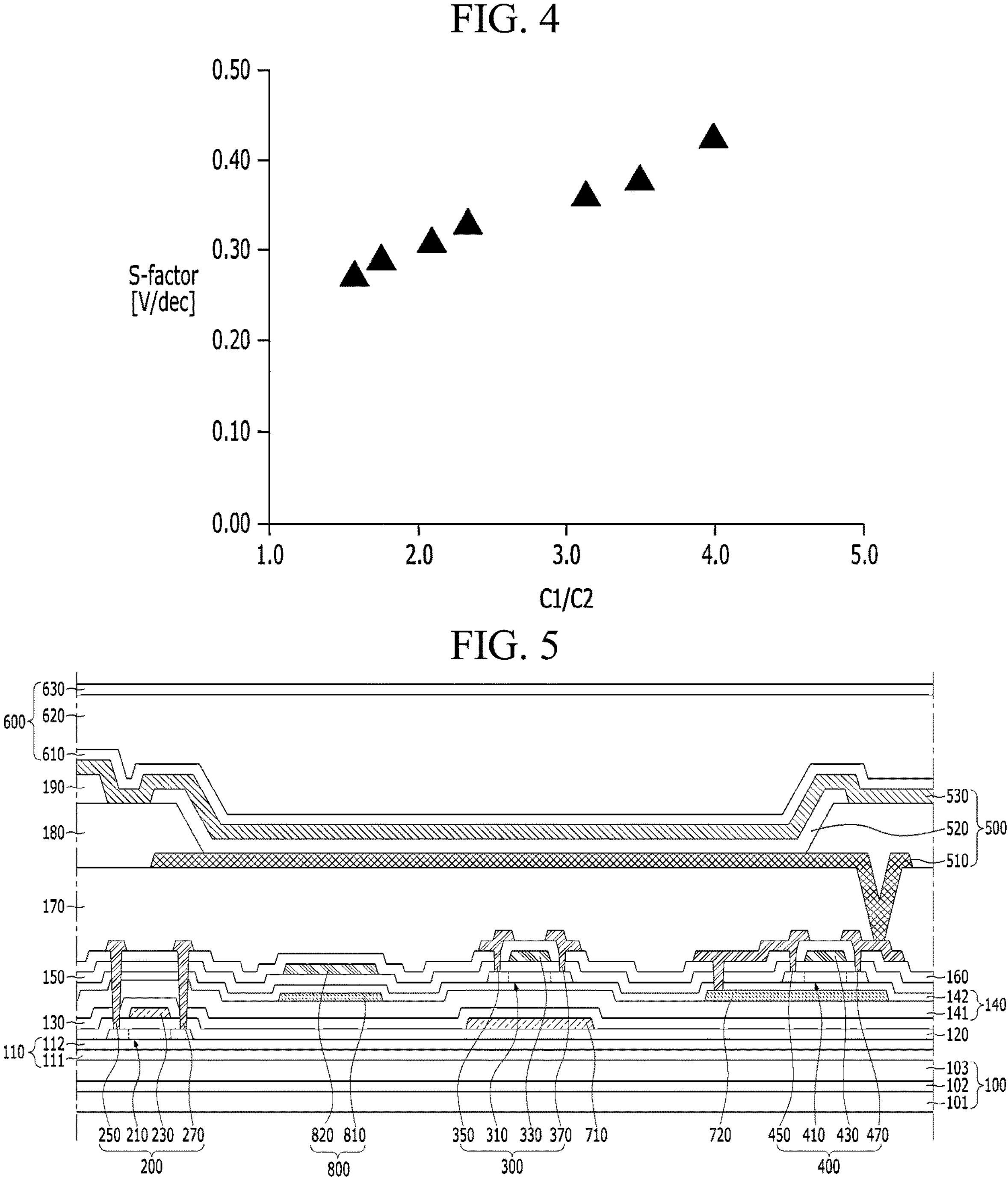
FIG. 4 is an example of a view showing S-factor of a driving thin film transistor in each pixel area according to a rate of a first capacitance and a second capacitance in the corresponding pixel area.

FIG. 4 is an example of a view showing S-factor of a driving thin film transistor in each pixel area according to a rate of a first capacitance and a second capacitance in the corresponding pixel area.

Referring to FIG. 4, S-factor of the driving thin film transistor 400 in each pixel area PA may be proportional to the ratio of the first capacitance C1 and the second capacitance C2 in the corresponding pixel area PA. Thus, the display panel DP of the display apparatus according to the example embodiment of the present disclosure may effectively increase S-factor of the driving thin film transistor 400 in each pixel area PA by increasing the first capacitance C1 of the parasitic capacitor formed between the second light-blocking pattern 720 and the driving semiconductor pattern 410 in each pixel area PA. For example, in the display panel DP of the display apparatus according to the example embodiment of the present disclosure, the second separation insulating layer 142 may have a thickness thinner than the first separation insulating layer 141 in each pixel area PA. That is, in the display panel DP of the display apparatus according to the example embodiment of the present disclosure, the second light-blocking pattern 720 may be disposed close to the driving semiconductor pattern 410 in each pixel area PA. For example, the second separation insulating layer 142 may have a thickness thinner than the second gate insulating layer 150. Therefore, in the display panel DP of the display apparatus according to the example embodiment of the present disclosure, the occurrence of the spot in low grayscale may be effectively prevented.

Accordingly, the display apparatus according to the example embodiment of the present disclosure may include the first switching thin film transistor 200 including the first semiconductor pattern 210 made of silicon, the second switching thin film transistor 300 including the second semiconductor pattern 310 made of an oxide semiconductor, the driving thin film transistor 400 including the driving semiconductor pattern 410 made of an oxide semiconductor, the first light-blocking pattern 710 overlapping with the second semiconductor pattern 310 and the second light-blocking pattern 720 overlapping with the driving semiconductor pattern 410 in each pixel area PA of the display panel DP, wherein the distance d2 between the second light-blocking pattern 720 and the driving semiconductor pattern 410 may be smaller than the distance d1 between the first light-blocking pattern 710 and the second semiconductor pattern 310. Thus, in the display panel DP of the display apparatus according to the example embodiment of the present disclosure, S-factor of the driving thin film transistor 400 in each pixel area PA may be increased, without changing the structure of the first switching thin film transistor 200 and the second switching thin film transistor 300 in each pixel area PA. Therefore, in the display panel DP of the display apparatus according to the example embodiment of the present disclosure, the occurrence of the spot in low grayscale may effectively prevented.

In addition, in the display panel DP of the display apparatus according to the example embodiment of the present disclosure, the size of the second light-blocking pattern 720 may be larger than the size of the driving semiconductor pattern 410. Thus, in the display panel DP of the display apparatus according to the example embodiment of the present disclosure, light diffracted from an end of the second light-blocking pattern 720 disposed close to the driving semiconductor pattern 410 may be not irradiated to the driving semiconductor pattern 410. Therefore, in the display panel DP of the display apparatus according to the example embodiment of the present disclosure, a change in the characteristics of the driving semiconductor pattern 410 due to the external light may be effectively prevented.

In the display apparatus according to another example embodiment of the present disclosure, a specific voltage may be applied to the first light-blocking pattern 710. A voltage applied to the first light-blocking pattern 710 may be the same as a voltage applied to the second gate electrode 330. For example, the first light-blocking pattern 710 may be electrically connected to the second gate electrode 330. Thus, in the display panel DP of the display apparatus according to another example embodiment of the present disclosure, the first light-blocking pattern 710 in each pixel area PA may serve as one gate electrode of double gate electrodes of the second switching thin film transistor 300 in the corresponding pixel area PA. That is, in the display panel DP of the display apparatus according to another example embodiment of the present disclosure, the second channel region of the second semiconductor pattern 310 in each pixel area PA may have an electrical conductivity corresponding to a voltage applied to the second gate electrode 330 in the corresponding pixel area PA and a voltage applied to the first light-blocking pattern 710 in the corresponding pixel area PA. Therefore, in the display panel DP of the display apparatus according to another example embodiment of the present disclosure, the operating characteristics of the second switching thin film transistor 300 in each pixel area PA may be improved. For example, in the display panel DP of the display apparatus according to another example embodiment of the present disclosure, the second switching thin film transistor 300 in each pixel area PA may be turn-on, quickly.

The display apparatus according to the example embodiment of the present disclosure provides that the first light-blocking pattern 710 is formed simultaneously with the first gate electrode 230. However, in the display apparatus according to another example embodiment of the present disclosure, the first light-blocking pattern 710 may be formed by a process different from a process of forming the first gate electrode 230. For example, in the display apparatus according to another example embodiment of the present disclosure, the first light-blocking pattern 710 may include a material capable of blocking the penetration of hydrogen. Thus, in the display apparatus according to another example embodiment of the present disclosure, the unintended conductorization of the second semiconductor pattern 310 in each pixel area PA due to the remaining hydrogen may be prevented. That is, in the display apparatus according to another example embodiment of the present disclosure, the malfunction of the second switching thin film transistor 300 in each pixel area PA may be prevented. Therefore, in the display apparatus according to another example embodiment of the present disclosure, the occurrence of the spot in low grayscale may be effectively prevented. The first light-blocking pattern 710 may include the same material as the second light-blocking pattern 720. For example, the first light-blocking pattern may include titanium (Ti).

The display apparatus according to another example embodiment of the present disclosure may further comprise a storage capacitor between the separation insulating layer and the over-coat layer in each pixel area. The storage capacitor may have a stacked structure of a capacitor lower electrode and a capacitor upper electrode. In the display apparatus according to another example embodiment of the present disclosure, the storage capacitor 800 may include the capacitor lower electrode 810 disposed on the same layer as the second light-blocking pattern 720, and the capacitor upper electrode 820 disposed on the same layer as the driving gate electrode 430, as shown in FIG. 5. Thus, in the display apparatus according to another example embodiment of the present disclosure, the capacitor lower electrode 810 and the capacitor upper electrode 820 of the storage capacitor 800 may be disposed on a layer different from signal lines, such as the scan lines, the data lines, the reference voltage supply lines and/or the power voltage supply lines. That is, in the display apparatus according to another example embodiment of the present disclosure, the distortion of a voltage stored in the storage capacitor 800 of each driving circuit due to a signal applied to the signal lines may be prevented. Therefore, in the display apparatus according to another example embodiment of the present disclosure, each of the driving circuit may be stably operated.

Figure 6:
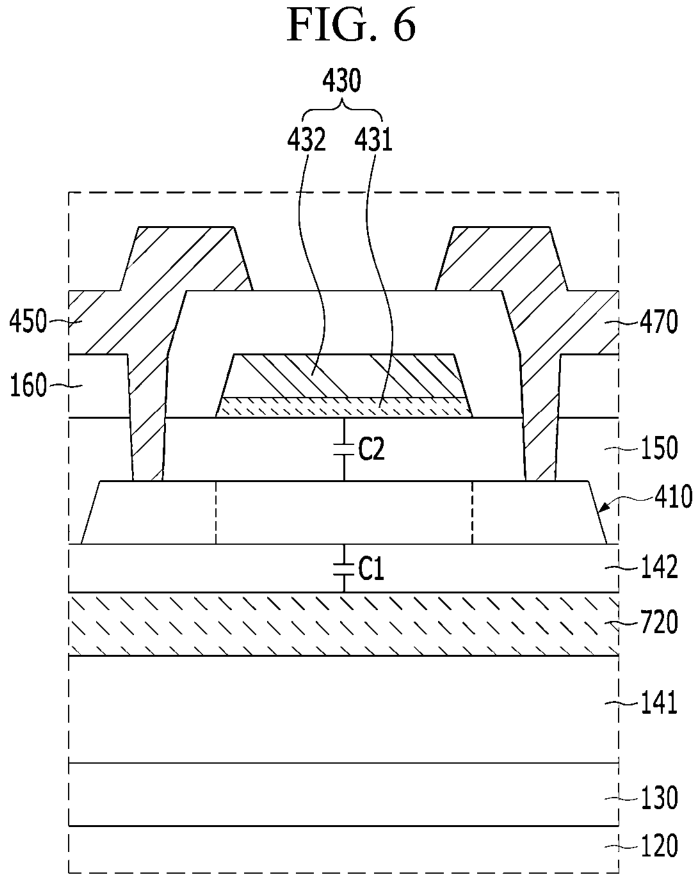

The display apparatus according to the example embodiment of the present disclosure provides that the driving gate electrode 430 of the driving thin film transistor 400 is a single layer. However, in the display apparatus according to another example embodiment of the present disclosure, the driving gate electrode 430 may have a multi-layer structure. For example, in the display apparatus according to another example embodiment of the present disclosure, the driving gate electrode 430 may have a stacked structure of a first driving gate 431 and a second driving gate 432, as shown in FIG. 6. The first driving gate 431 may be disposed close to the second gate insulating layer 150. The second driving gate 432 may be disposed on the first driving gate 431. For example, the first driving gate 431 may be disposed between the second gate insulating layer 150 and the second driving gate 432.

The first driving gate 431 may include a material different from the second driving gate 432. The first driving gate 431 may include a material capable of blocking the penetration of hydrogen. The first driving gate 431 may include the same material as the second light-blocking pattern 720. For example, the first driving gate 431 may include titanium (Ti). Thus, in the display apparatus according to another example embodiment of the present disclosure, hydrogen generated by a subsequent process may not penetrate into the third channel region of the driving semiconductor pattern 410. Therefore, in the display apparatus according to another example embodiment of the present disclosure, the reliability for the operating characteristics of the driving thin film transistor 400 may be improved.

The second driving gate 432 may have a resistance lower than the first driving gate 431. Thus, in the display apparatus according to another example embodiment of the present disclosure, a signal delay and a voltage drop due to the first driving gate 431 may be prevented. For example, in the display apparatus according to another example embodiment of the present disclosure, a thickness of the second driving gate 432 may be thicker than a thickness of the first driving gate 431. Therefore, in the display apparatus according to another example embodiment of the present disclosure, the degree of freedom with respect to a material of the first driving gate 431 may be improved.

The first driving gate 431 may be formed simultaneously with the second driving gate 432. For example, a step of forming the first driving gate 431 and the second driving gate 432 may include a step of forming a first conductive material layer on the second gate insulating layer 150, a step of forming a second conductive material layer on the first conductive material layer, and a step of sequentially patterning the second conductive material layer and the first conductive material layer. The second gate electrode of the second switching thin film transistor may be formed simultaneously with the driving gate electrode 430. The second gate electrode of the second switching thin film transistor may have the same structure as the driving gate electrode 430. For example, the second gate electrode may have a double-layer structure of a first switching gate and a second switching gate. The first switching gate may include the same material as the first driving gate 431. The second switching gate may include the same material as the second driving gate 432. Thus, in the display apparatus according to another example embodiment of the present disclosure, the reliability for the operating characteristics of the second switching thin film transistor may be improved. Therefore, in the display apparatus according to another example embodiment of the present disclosure, the operating characteristics of each driving circuit may be improved.

A display apparatus according to one or more example embodiments of the present disclosure may include the first switching thin film transistor, the second switching thin film transistor and the driving thin film transistor in each pixel area of the device substrate, wherein the second semiconductor pattern of the second switching thin film transistor and the driving semiconductor pattern of the driving thin film transistor may include an oxide semiconductor, unlike the first semiconductor pattern of the first switching thin film transistor, wherein the light-blocking pattern may be disposed between the device substrate and the second semiconductor pattern, and between the device substrate and the driving semiconductor pattern, and wherein the capacitance between the light-blocking pattern (which is disposed between the device substrate and the driving semiconductor pattern) and the driving semiconductor pattern may have a relative low value. Thus, in the display apparatus according to one or more example embodiments of the present disclosure, the characteristics of the driving thin film transistor in each pixel area may be changed without changing the characteristics of the switching thin film transistor in the corresponding pixel area. That is, in the display apparatus according to one or more example embodiments of the present disclosure, the current variation value according to the voltage applied to the gate electrode of the driving thin film transistor may be reduced without changing the characteristics of the switching thin film transistor. Thereby, in the display apparatus according to one or more example embodiments of the present disclosure, the occurrence of the spot in low grayscale may be prevented.

It will be apparent to those skilled in the art that various modifications and variations can be made in the present disclosure without departing from the scope of the present disclosure. Thus, it is intended that the present disclosure covers the modifications and variations of this disclosure provided they come within the scope of the appended claims and their equivalents.

What is claimed is:

1. A display apparatus, comprising:

a first separation insulating layer on a device substrate;

a first switching thin film transistor on the device substrate in a pixel area for displaying an image, the first switching thin film transistor including a first semiconductor pattern between the device substrate and the first separation insulating layer and a first gate electrode on the first semiconductor pattern;

a second switching thin film transistor on the first separation insulating layer in the pixel area, the second switching thin film transistor including a second semiconductor pattern made of a material different from the first semiconductor pattern, the second switching thin film transistor including a second gate electrode disposed above the second semiconductor pattern;

a driving thin film transistor on the first separation insulating layer in the pixel area, the driving thin film transistor including a driving semiconductor pattern made of a same material as the second semiconductor pattern, the driving thin film transistor including a driving gate electrode disposed above the driving semiconductor pattern;

a first light-blocking pattern between the device substrate and the first separation insulating layer in the pixel area, the first light-blocking pattern overlapping with the second semiconductor pattern without any metal layer being interposed between the first light-blocking pattern and the second semiconductor pattern; and a second light-blocking pattern disposed above the first separation insulating layer in the pixel area, the second light-blocking pattern overlapping with the driving semiconductor pattern, wherein the second light-blocking pattern includes a conductive material, wherein a distance between the second light-blocking pattern and the driving semiconductor pattern is smaller than a distance between the first light-blocking pattern and the second semiconductor pattern, wherein the first light-blocking pattern in the pixel area is disposed between a first gate insulating layer positioned below the first gate electrode and a first interlayer insulating layer that covers the first gate electrode, the first light-blocking pattern being placed below the first interlayer insulating layer, wherein the second light-blocking pattern is disposed on the first interlayer insulating layer, and wherein a distance between the second light-blocking pattern and the driving semiconductor pattern is less than a distance between the second gate electrode and the second semiconductor pattern and is less than a distance between the driving gate electrode and the driving semiconductor pattern.

2. The display apparatus according to claim 1, wherein the first semiconductor pattern includes silicon, and the second semiconductor pattern and the driving semiconductor pattern include an oxide semiconductor.

3. The display apparatus according to claim 1, wherein the first light-blocking pattern includes a material different from the second light-blocking pattern.

4. The display apparatus according to claim 3, wherein the first light-blocking pattern includes a same material as the first gate electrode of the first switching thin film transistor.

5. The display apparatus according to claim 1, further comprising a second separation insulating layer between the second light-blocking pattern and the driving semiconductor pattern, wherein the second separation insulating layer extends between the first separation insulating layer and the second semiconductor pattern.

6. The display apparatus according to claim 5, wherein the second separation insulating layer has a thickness thinner than the first separation insulating layer.

7. The display apparatus according to claim 5, wherein the second separation insulating layer includes a same material as the first separation insulating layer.

8. The display apparatus according to claim 7, wherein the first separation insulating layer and the second separation insulating layer are an inorganic insulating layer made of silicon oxide.

9. A display apparatus, comprising:

a first switching thin film transistor on a device substrate in a pixel area for displaying an image, the first switching thin film transistor including a first semiconductor pattern, a first gate electrode, a first source electrode and a first drain electrode;

a first gate insulating layer on the device substrate, the first gate insulating layer between the first semiconductor pattern and the first gate electrode;

a first separation insulating layer on the first gate insulating layer, the first separation insulating layer between the first gate electrode and the first source electrode and between the first gate electrode and the first drain electrode;

a second switching thin film transistor on the first separation insulating layer in the pixel area, the second switching thin film transistor including a second semiconductor pattern, a second gate electrode, a second source electrode and a second drain electrode;

a first light-blocking pattern between the first gate insulating layer and the first separation insulating layer in the pixel area, the first light-blocking pattern overlapping with the second semiconductor pattern without any metal layer being interposed between the first light-blocking pattern and the second semiconductor pattern;

a driving thin film transistor disposed in the pixel area and being spaced apart from the first switching thin film transistor and the second switching thin film transistor, the driving thin film transistor including a driving semiconductor pattern, a driving gate electrode, a driving source electrode and a driving drain electrode;

a second light-blocking pattern on the first separation insulating layer in the pixel area, the second light-blocking pattern including a conductive material and overlapping with the driving semiconductor pattern;

a second separation insulating layer between the second light-blocking pattern and the driving semiconductor pattern, the second separation insulating layer extending between the first separation insulating layer and the second semiconductor pattern; and a second gate insulating layer between the driving semiconductor pattern and the driving gate electrode, the second gate insulating layer extending between the second semiconductor pattern and the second gate electrode, wherein a first capacitance between the second light-blocking pattern and the driving semiconductor pattern is larger than a second capacitance between the driving semiconductor pattern and the driving gate electrode, wherein the first light-blocking pattern in the pixel area is disposed between the first gate insulating layer positioned below the first gate electrode and a first interlayer insulating layer that covers the first gate electrode, the first light-blocking pattern being placed below the first interlayer insulating layer, wherein the second light-blocking pattern is disposed on the first interlayer insulating layer, and wherein a distance between the second light-blocking pattern and the driving semiconductor pattern is less than a distance between the second gate electrode and the second semiconductor pattern and is less than a distance between the driving gate electrode and the driving semiconductor pattern.

10. The display apparatus according to claim 9, wherein a capacitance between the second semiconductor pattern and the second gate electrode is same as the second capacitance.

11. The display apparatus according to claim 9, wherein the second light-blocking pattern is electrically connected to the driving source electrode.

12. The display apparatus according to claim 9, further comprising a storage capacitor being spaced apart from the first switching thin film transistor, the second switching thin film transistor and the driving thin film transistor, wherein the storage capacitor includes a capacitor lower electrode and a capacitor upper electrode, which are stacked on the first separation insulating layer.

13. The display apparatus according to claim 12, wherein the capacitor lower electrode includes a same material as the second light-blocking pattern, wherein the capacitor upper electrode includes a same material as the driving gate electrode, and wherein the second separation insulating layer and the second gate insulating layer extend between the capacitor lower electrode and the capacitor upper electrode.

14. The display apparatus according to claim 1, wherein a thickness of a second separation insulating layer disposed between the second light-blocking pattern and the driving semiconductor pattern is thinner than a thickness of a second gate insulating layer disposed between the second gate electrode and the second semiconductor pattern and between the driving gate electrode and the driving semiconductor pattern.

15. The display apparatus according to claim 1, wherein a distance between the driving gate electrode and the second light-blocking pattern is smaller than a distance between the second gate electrode and the first light-blocking pattern.

16. The display apparatus according to claim 1, wherein the second light-blocking pattern corresponds to a lowest metal layer between the driving thin film transistor and the device substrate.

* * * * *